United States Patent
Ooae et al.

(10) Patent No.: US 8,530,857 B2
(45) Date of Patent: Sep. 10, 2013

(54) STAGE DEVICE

(75) Inventors: Yoshihisa Ooae, Tokyo (JP); Youichi Shimizu, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 12/932,246

(22) Filed: Feb. 22, 2011

(65) Prior Publication Data

US 2011/0204255 A1     Aug. 25, 2011

Related U.S. Application Data

(63) Continuation of application No. PCT/JP2010/052681, filed on Feb. 23, 2010.

(51) Int. Cl.
*G21K 5/08*     (2006.01)
(52) U.S. Cl.
USPC ............ 250/440.11; 250/441.11; 250/442.11; 250/443.1; 355/72; 355/73; 355/75; 355/76; 355/77
(58) Field of Classification Search
USPC ............... 250/440.11, 441.11, 442.11, 443.1; 355/72, 73, 75, 76, 77
See application file for complete search history.

(56) References Cited

U.S. PATENT DOCUMENTS

| | | | | |
|---|---|---|---|---|
| 2002/0085192 A1* | 7/2002 | Miura et al. | .................... | 355/73 |
| 2002/0118897 A1* | 8/2002 | Sakino et al. | .................. | 384/12 |
| 2005/0168076 A1* | 8/2005 | Hazelton | ........................ | 310/12 |

FOREIGN PATENT DOCUMENTS

| | | |
|---|---|---|
| JP | 2002-170765 | 6/2002 |
| JP | 2002-252166 | 9/2002 |
| JP | 2005-005394 | 1/2005 |
| JP | 2006-066589 | 3/2006 |
| JP | 2007-146995 | 6/2007 |

* cited by examiner

*Primary Examiner* — Nicole Ippolito
(74) *Attorney, Agent, or Firm* — Muramatsu & Associates

(57) ABSTRACT

A stage device to be used in a vacuum includes: a gas supply unit for generating a gas; a base member having upper, lower, right, and left surfaces; a slider formed in a frame shape surrounding the base member and having surfaces facing the respective surfaces of the base member, and disposed to be movable; and an air bearing configured to float the slider by supplying the gas to a space between the base member and the slider. The slider includes: an air chamber provided on the surface facing the base member for accumulating air, and the base member includes thereinside a slider-moving air flow passage configured to guide the gas from an inlet port to an outlet port for supplying the gas to the air chamber of the slider.

11 Claims, 11 Drawing Sheets

STAGE DEVICE

CROSS-REFERENCE TO RELATED APPLICATIONS

This application is a continuation of prior International Patent Application No. PCT/JP2010/052681, filed Feb. 23, 2010, the entire contents of which are incorporated herein by reference.

BACKGROUND OF INVENTION

1. Field of Invention

The present invention relates to a stage device, and particularly to a stage device using an air bearing in a vacuum in an electron beam exposure apparatus or the like.

2. Background Art

In electron beam exposure apparatuses and electron microscopes, a sample is exposed, observed, or measured while being mounted on a stage. For example, an electron beam exposure apparatus performs an exposure process while moving a stage in accordance with exposure data so that a required position on a wafer may be exposed.

A roller stage of cross roller type has been provided as a stage including a mechanical bearing. Regarding this stage, multiple rollers provided in a track between a movable stage and a fixed stage are rolled (rotated) to move the stage.

When such a stage with a mechanical bearing is used in a state where a particle exists on a track, the particle causes strain in the stage mechanism. Such strain degrades the accuracy of stage position detection, and makes it difficult to detect a stage position accurately. Moreover, a particle does not remain at a certain place on the track but moves as the stage moves. This phenomenon hinders replication of the position change of the stage and prediction of a position where to move the stage. Thus, the stage mechanism has difficulty in correcting the position of the stage. Further, in the case where oil is applied to the track and the rollers for lubrication of the track and the prevention of dust generation, particles can be removed to a certain extent while the oil exists, but dust may be generated rapidly when the oil is lost.

In contrast to the stages using mechanical bearings, techniques using air bearings are coming to be studied and used. For example, Japanese Patent Application Publication No. 2006-66589 describes a stage device in an exposure apparatus for use in photolithography. In the stage device, a movable member is supported on a base member in a noncontact manner using a fluid bearing (gas bearing).

When such an air bearing is used, the degradation of accuracy of a stage caused by particles on the track of the stage can be reduced compared to when a mechanical bearing is used.

On the other hand, when an air bearing stage is used, air needs to be supplied for driving a stage mechanism. Usually, the air generated by an air generator is supplied to the stage via air piping made of a PTFE-based material which is usable in a vacuum chamber.

In this case, the air piping in this vacuum chamber moves every time the stage moves, and accordingly is partly bent. Since a moving range of the stage is limited, the air piping is frequently bent nearly at the same portion, and therefore may be ruptured due to fatigue after numerous bending actions. For this reason, the operating life of the entire stage device is determined by a defect of the air piping even if the stage itself has no failure. For example, continuous use of a typical stage device available at present requires replacement of the piping every several years.

DISCLOSURE OF INVENTION

The present invention has been made in view of the problems of the conventional technology, and has an objective to provide a stage device which has no risk that air piping may rupture due to bending actions along with movement of the stage.

In order to solve the above problems of the conventional technology, according to a preferred aspect of the present invention, a stage device to be used in a vacuum environment, comprising: a gas supply unit configured to generate a gas; a base member having four of upper, lower, right, and left surfaces; a slider formed in a frame shape surrounding the base member and having surfaces facing the respective four surfaces of the base member, and disposed to be movable; and an air bearing configured to float the slider by supplying the gas to a space between the base member and the slider. The slider includes an air chamber provided on the surfaces facing the base member and configured to accumulate air; and the base member includes thereinside a slider-moving air flow passage configured to supply the gas from an inlet port for guiding the gas generated by the gas supply unit to an outlet port for supplying the gas to the air chamber of the slider.

In the stage device according to this aspect, the base member includes a pressure receiving plate configured to divide the air chamber of the slider into a first air chamber and a second air chamber, and the slider-moving air flow passage includes a first air flow passage and a second air flow passage, and is configured to supply the air from the outlet port of the first slider-moving air flow passage to the first air chamber and to supply the air from the outlet port of the second slider-moving air flow passage to the second air chamber. Additionally, the slider includes the air chambers located on both the upper and lower surfaces or both the right and left surfaces of the slider being opposed to each other and facing the base member, and the outlet ports of the slider-moving air flow passages formed inside the base member respectively supply the air to the air chambers on both the surfaces.

Moreover, in the stage device according to this aspect, the slider includes an air pad configured to emit the air for floating the slider above the base member, and an air supply groove configured to supply the air to the air pad, and the base member includes an air flow passage for air pad configured to connect a supply port for supplying the air generated by the gas supply unit to an air outlet port for infusing the air into the air supply groove. Additionally, the infused air is supplied to the air pad of the slider through (piping) buried inside the slider.

Furthermore, the stage device according to this aspect further comprises a first slider and a second slider configured to move simultaneously in a direction perpendicular to a moving direction of the slider. One end of the base member is connected to the first slider and another end of the base member is connected to the second slider, the air supplied to any of the slider-moving air flow passage and the air flow passage for air pad inside the base member is supplied through the first slider and the second slider. Additionally, the first slider is formed into a frame shape around a first fixed member and the second slider is formed into a frame shape around a second fixed member, a flow passage inside the first slider is connected to a flow passage formed inside the first fixed member through a first air supply groove formed on a surface of the first slider facing the first fixed member, and a flow passage inside the second slider is connected to a flow passage formed inside the second fixed member through a second air supply groove formed on a surface of the second slider facing the second fixed member. In addition, the stage device further comprises a first end plate located between the base member and the first slider; and a second end plate located between the base member and the second slider. The air flow passage formed inside the base member includes a first flow passage and a second flow passage, the air is supplied to the first flow passage in the base member through the flow passage formed inside first fixed member, a passage hole formed inside the first slider, and a passage hole formed in the first end plate, and the air is supplied to the second flow passage in the base member through the flow passage formed inside second fixed member, a passage hole formed inside the second slider, and a passage hole formed in the second end plate.

According to the stage device of the present invention, the air flow passage is provided inside the base member. Moreover, the stage device supplies the air necessary for moving the slider to the air chamber and necessary for floating the slider to the air supply groove of the slider through this flow passage. In this way, it is not necessary to use the piping for air supply inside the vacuum chamber, which makes it possible to eliminate a risk of rupture of the piping and to avoid dependency of the operating life of the stage on the operating life of the piping.

DESCRIPTION OF EMBODIMENTS (1) First Embodiment

Now, embodiments of the present invention will be described below with reference to the accompanying drawings. First, a configuration of an electron beam exposure apparatus and a stage device will be described with reference to FIG. 1 to FIG. 5B. Then, an air supply mechanism not requiring air supply pipes inside a vacuum chamber will be described with reference to FIG. 6 to FIG. 8. Note that although the following description is intended for the case of using a stage device in an electron beam exposure apparatus, the present invention is not limited thereto. It is of course possible to use the stage device as a stage in a different vacuum apparatus such as an electron microscope.

(Configurations of Electron Beam Exposure Apparatus and Stage Device)

Figure 1:
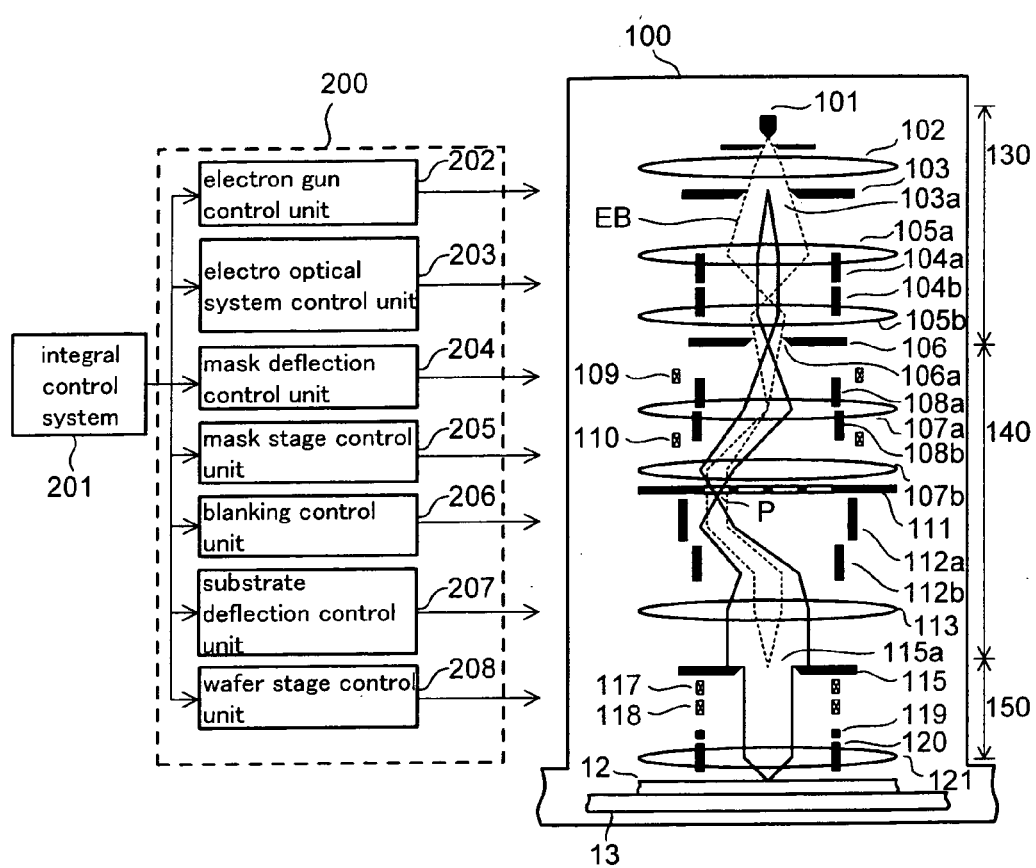
FIG. 1 is a configuration diagram of an electron beam exposure apparatus.

FIG. 1 is a schematic configuration diagram of an electron beam exposure apparatus provided with a stage device according to this embodiment.

The electron beam exposure apparatus is roughly divided into an exposure unit 100 and a digital control unit 200 configured to control the exposure unit 100. The exposure unit 100 includes an electron beam generating section 130, a mask deflecting section 140, and a substrate deflecting section 150.

In the electron beam generating section 130, an electron beam EB generated from an electron gun 101 is subjected to a convergence action of a first electromagnetic lens 102. Then, the electron beam EB passes through a rectangular aperture 103a (a first opening) on a beam shaping mask 103, whereby a cross section thereof is shaped into a rectangle.

The electron beam EB shaped into the rectangle forms an image on a second mask 106 for beam shaping by way of a second electromagnetic lens 105a and a third electromagnetic lens 105b. Thereafter, the electron beam EB is deflected by a first electrostatic deflector 104a and a second electrostatic deflector 104b provided for variable rectangular shaping and passes through a rectangular aperture 106a (a second opening) of the second mask 106 for beam shaping. The electron beam EB is thus shaped by the first and second openings.

Thereafter, the electron beam EB forms an image on a stencil mask 111 by a fourth electromagnetic lens 107a and a fifth electromagnetic lens 107b in the mask deflecting section 140. Then, the electron beam EB is deflected by a third electrostatic deflector 108a (also referred to as a first selective deflector) and a fourth electrostatic deflectors 108b (also referred to as a second selective deflector) in line with a specific pattern P formed on the stencil mask 111, whereby a cross-sectional shape of the electron beam EB is formed into the shape of the pattern P. The pattern is also referred to as a character projection (CP) pattern. The electron beam EB is bent so as to be incident on the stencil mask 111 parallel to an optical axis by a deflector 108b disposed in the vicinity of the fifth electromagnetic lens 107b.

While the stencil mask 111 is fixed to a mask stage, the mask stage is movable in a horizontal plane. When using the pattern P located outside a deflection range (a beam deflection region) of the third electrostatic deflector 108a and the fourth electrostatic deflector 108b, the pattern P is shifted to the beam deflection region by moving the mask stage.

A sixth electromagnetic lens 113 disposed under the stencil mask 111 has a role to collimate the electron beam EB in the vicinity of a shield plate 115 by adjusting an amount of a current flowing thereon.

The electron beam EB passing through the stencil mask 111 is bent back to the optical axis by deflecting actions of a fifth electrostatic deflector 112a (also referred to as a first bend-back deflector) and a sixth electrostatic deflector 112b (also referred to as a second bend-back deflector). The electron beam EB is bent by the deflector 112b disposed in the vicinity of the sixth electromagnetic lens 113 so as to be aligned with the axis and to travel along the axis thereafter.

The mask deflecting section 140 includes first and second correction coils 109 and 110 configured to correct beam deflection aberrations caused by the first to sixth electrostatic deflectors 104a, 104b, 108a, 108b, 112a, and 112b.

Thereafter, the electron beam EB passes through an aperture 115a (a round aperture) of the shield plate 115 constituting the substrate deflecting section 150, and is projected onto a substrate 12 by an electromagnetic projection lens 121. In this way, an image of the pattern on the stencil mask 111 is transferred onto the substrate 12 at a predetermined reduction ratio such as 1/10.

The substrate deflecting section 150 includes a seventh electromagnetic deflector 119 and an eighth electromagnetic deflector 120. The electron beam EB is deflected by these deflectors 119 and 120, whereby the image of the pattern on the stencil mask 111 is projected in a predetermined position on the substrate.

Moreover, the substrate deflecting section 150 is also provided with third and fourth correction coils 117 and 118 configured to correct deflection aberrations of the electron beam EB on the substrate.

The digital control unit 200 includes an electron gun control unit 202, an electrooptical system control unit 203, a mask deflection control unit 204, a mask stage control unit 205, a blanking control unit 206, a substrate deflection control unit 207, and a wafer stage control unit 208. The electron gun control unit 202 controls the electron gun 101 and thereby controls an acceleration voltage, beam radiation conditions, and the like of the electron beam EB. The electrooptical system control unit 203 controls parameters including amounts of currents flowing on the electromagnetic lenses 102, 105a, 105b, 107a, 107b, 113, and 121 and thereby adjusts magnifications, focal positions, and the like of electrooptical system formed of these electromagnetic lenses. The blanking control unit 206 controls a voltage to be applied to a blanking deflector so as to deflect the electron beam EB, which has been generated prior to the start of the exposure, onto the shield plate 115 and thereby to prevent the electron beam EB from being applied onto the substrate 12 prior to the exposure.

The substrate deflection control unit 207 controls voltages to be applied to the seventh electrostatic deflector 119 and the eighth electrostatic deflector 120 and thereby deflects the electron beam EB in the predetermined position on the substrate 12. The wafer stage control unit 208 moves a the substrate 12 in a horizontal direction by adjusting a drive amount of a drive unit 25 so as to apply the electron beam EB to a desired position on the substrate 12. All of the units 202 to 208 described above are integrally controlled by an integration control system 201 such as a workstation.

Figure 2:
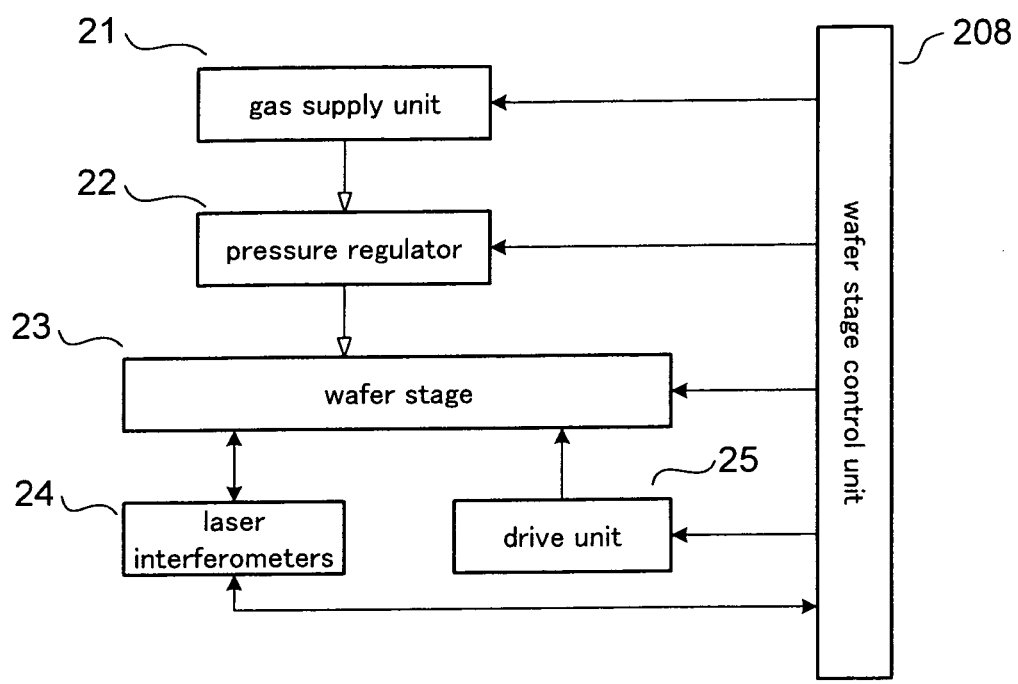
FIG. 2 is a block configuration diagram of a sample stage device in the exposure apparatus shown in FIG. 1.

FIG. 2 shows a block configuration diagram of the stage device on which the sample is to be mounted in the exposure apparatus. The stage device basically includes a gas supply unit 21, a pressure regulator 22, a wafer stage 23, laser interferometers 24, the drive unit 25, and the wafer stage control unit 208.

The gas supply unit 21 generates and sends out clean dry air (CDA).

The pressure regulator 22 is disposed in the middle of a gas flow path for connecting the gas supply unit 21 to a supply port of an air bearing of the wafer stage 23 and is configured to adjust a pressure of gas to be supplied to the air bearing. The pressure regulator 22 includes an electropneumatic regulator configured to adjust the pressure of gas and to eject the gas at a preset pressure.

The laser interferometers 24 are respectively disposed in a position facing a side surface of the wafer stage 23 and another position facing a different side surface perpendicular to the side surface, and are configured to measure the position of the wafer stage 23 and postures (pitching, rolling, and yawing) of the wafer stage 23 from two directions perpendicular to each other. The laser interferometer 24 also is provided above the wafer stage 23 for measuring a height (vertical position) of the wafer stage 23.

The wafer stage control unit 208 detects the position of the wafer stage 23 with high accuracy by controlling the gas supply unit 21, the pressure regulator 22, and the laser interferometer 24.

Figure 3:
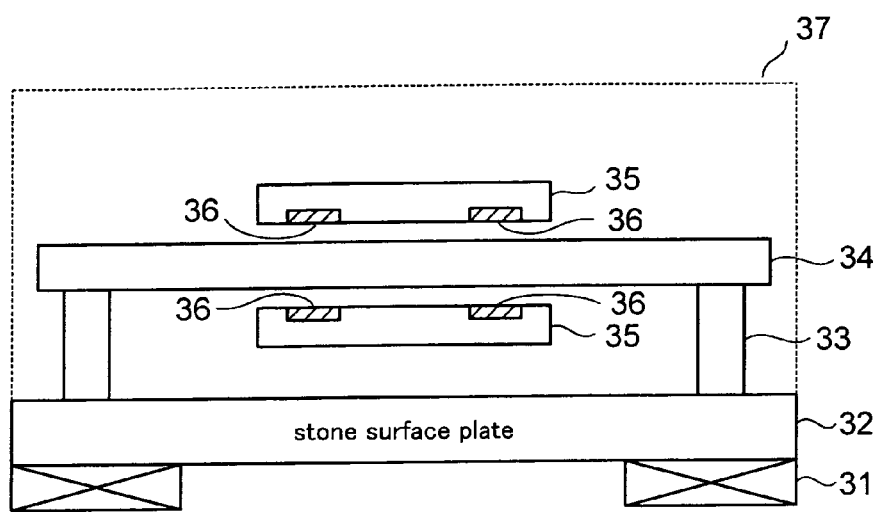
FIG. 3 is a schematic configuration diagram of main parts using an air bearing in the sample stage device.

FIG. 3 is a schematic configuration diagram of main parts of the stage using the air bearing in the sample stage device.

The sample stage includes a slider 35 on which the sample is to be mounted and a square shank (a base member) 34, which are disposed in a vacuum chamber 37. The slider 35 is formed into a frame shape so as to surround the square shank 34 and is configured to move along with the square shank 34. The square shank 34 is disposed on a stone surface plate 32 disposed on a vibration isolated table 31 by use of support rods 33.

Figure 4:
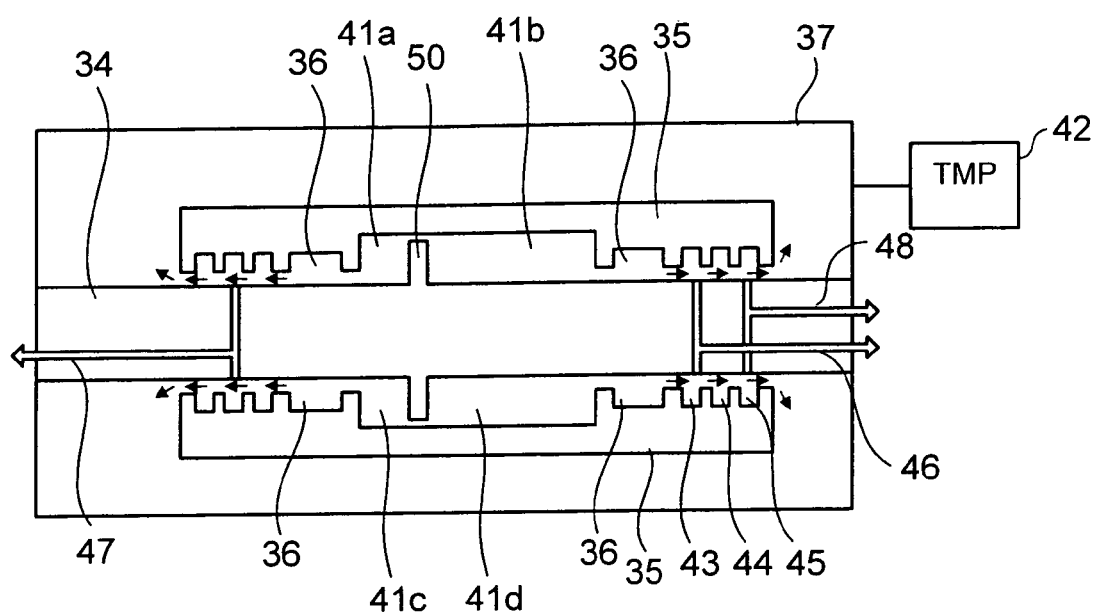
FIG. 4 is a view (part 1) for explaining the main parts using the air bearing in the sample stage device.

FIG. 4 is a view for explaining an air servo stage. The square shank 34 and the slider 35 are disposed in the vacuum chamber 37 evacuated with a turbomolecular pump 42.

The slider 35 includes air pads 36 configured to emit the air sent from the gas supply unit 21 into the square shank 34, and a differential exhaust unit configured to adjust the pressure of the emitted air so as to prevent the air from flowing out of a clearance between the slider 35 and the square shank 34.

The air pads 36 are made of aluminum ceramics or zirconia ceramics, for example, and are provided with openings which determine a state of distribution of the air.

The pressure of the air to be supplied to the air pads 36 is 0.5 [MPa], for example. The slider 35 is floated by emitting the air into the air pads 36 through the square shank 34.

The differential exhaust unit includes exhaust ports 43, 44, and 45. The pressure of the air is gradually reduced from the clearance to the outside by discharging the air through the exhaust ports 43, 44, and 45. For example, the air pressure is set to 0.1 [MPa] by use of the exhaust port 43 and an exhaust groove 46, then to 400 [Pa] by use of the exhaust port 44 and an exhaust groove 47, and then to 1 [Pa] by use of the exhaust port 45 and an exhaust groove 48. In this way, the air flow on the outside of the clearance becomes 0.0001 [L/min] which means that the air hardly flows there. Hence it is possible to maintain a vacuum state in the vacuum chamber 37.

The slider 35 is provided with cylinder spaces (air chambers) 41a to 41d configured to accumulate the air necessary for forming an air cylinder mechanism to move the slider 35. A pressure receiving plate 50 is formed on the square shank 34 in a direction toward the cylinder space 41.

Figure 5A:
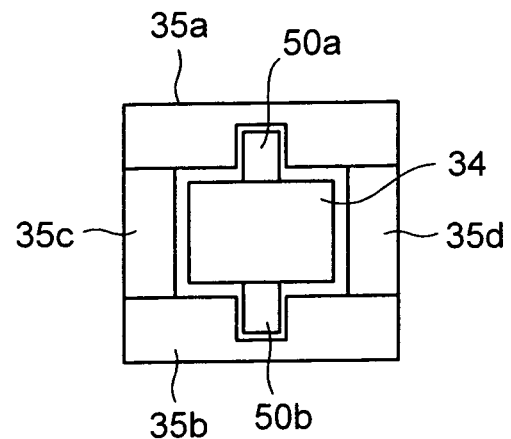
FIGS. 5A and 5B are views (part 2) for explaining the main parts using the air bearing in the sample stage device.
Figure 5B:
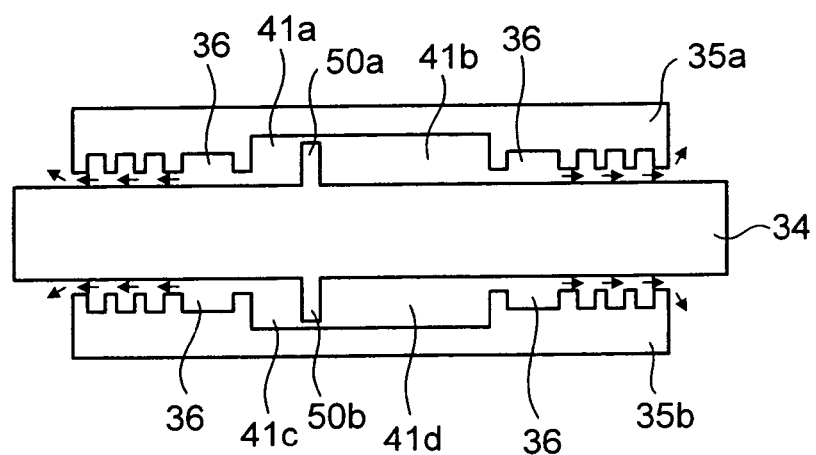

FIGS. 5A and 5B are views for explaining a structure of an air servo. FIG. 5A is a vertical sectional view taking along a direction perpendicular to a moving direction of the slider for showing structure of the square shank and the slider related to the air servo while FIG. 5B is a transverse sectional view taken along a direction parallel to the moving direction of the slider.

As shown in FIGS. 5A and 5B, pressure receiving plates 50a and 50b are attached to the square shank and do not contact the slider 35 with a gap (a clearance) in a range from 10 to 20 μm. A clearance between the square shank 34 and the slider 35 is set in a range from 3 to 4 μm when floating. Accordingly, the pressure receiving plate 50 is prevented from contacting the slider 35 irrespective of whether the air bearing is floating or not floating.

The pressure receiving plate 50 divides the cylinder space 41 into two spaces and the slider 35 is allowed to move in a desired direction by generating a difference in the pressure to be applied to the pressure receiving plate 50 depending on amounts of the air to be supplied to the cylinder spaces.

Moreover, the movement of the slider 35 is stopped by setting the difference in the pressure to zero.

A stage drive method using the air servo has an advantage that it is easy to obtain high thrust. For example, when the difference in the pressure between the right and left cylinder space is 0.2 MPa and the area of the pressure receiving plate 50 is 28 cm$^2$ (14 cm$^2$ per side), then it is possible to obtain thrust of about 550 N (56 kgf). Therefore, it is possible to accelerate the slider of 50 kg at 1 G or higher.

Figure 6:
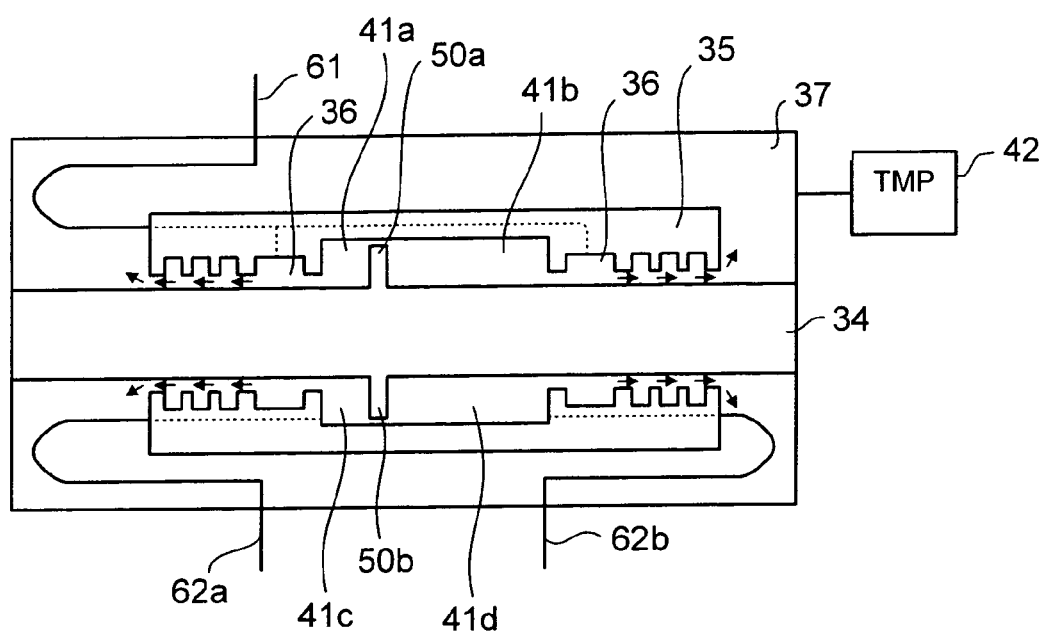
FIG. 6 is a view for explaining an air supply pipe in a conventional sample stage device.

FIG. 6 is a view showing a configuration of a conventional air bearing stage. As shown in FIG. 6, air is supplied to the air pads 36 in the slider 35 through an air supply pipe 61 and piping inside the slider 35. In addition, the air is supplied to the cylinder spaces 41c and 41d of the slider 35 through the air supply pipes 62a, 62b and the piping inside the slider 35.

In this way, air supply pipes 61, 62a, and 62b provided in a vacuum chamber 37 moves along movement of the slider 35 and therefore generate bent portions. It is necessary to replace the air supply pipes (61, 62a, and 62b) before these bent portions cause fatigue and rupture.

According to this embodiment, an air supply mechanism not requiring such air supply pipes which will be deteriorated by bending actions and the like is provided in the vacuum chamber. Now, the air supply mechanism in the stage device using the air bearing will be described below with reference to FIG. 7 and FIG. 8.

Figure 7:
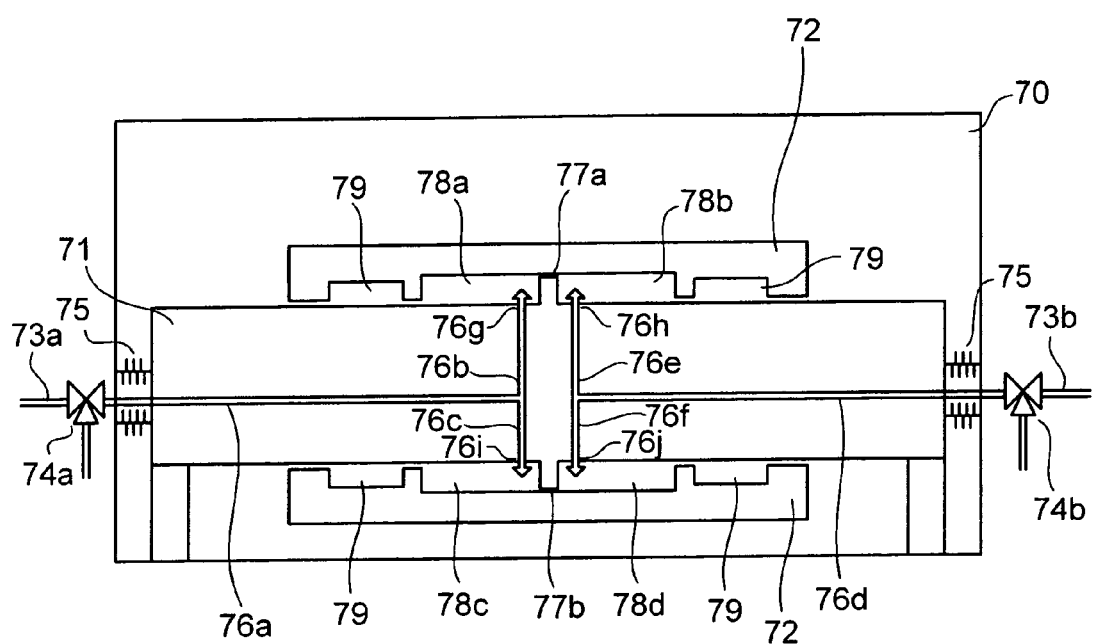
FIG. 7 is a schematic configuration diagram of main parts of the sample stage device provided with air flow passages, which are located inside a square shank and used for an air servo unit to move a slider.

FIG. 7 is a view for explaining the stage device using the air bearing of this embodiment. FIG. 7 shows a cross sectional view of a square shank 71 and a slider 72 which are disposed in a vacuum chamber 70. The square shank (base member) 71 is fixed to the vacuum chamber 70 by use of support rods 33 (FIG. 3) and bellows 75.

The slider 72 includes air pads 79 and a cylinder space 78 for accumulating air for moving the slider by use of the difference in the pressure of the air, which are located on a surface facing the square shank 71. The square shank 71 includes flow passages 76a to 76f for feeding the air. Moreover, a pressure receiving plate 77 is provided to face the cylinder space 78 of the slider 72.

The pressure receiving plate 77 is configured to divide the cylinder space (air chamber) 78 of the slider 72 into two regions. Specifically, the cylinder space 78 is divided into a cylinder space 78a and a cylinder space 78b on an upper side of the slider 72 by a pressure receiving plate 77a when the slider 72 is floating.

The pressure applied to the pressure receiving plate 77a varies depending on the amounts of air supplied to the cylinder space (air chamber) 78a and the cylinder space (air chamber) 78b of the slider 72. The slider 72 moves in a right-to-left direction in FIG. 7 by the difference in the pressure.

The air in the cylinder space 78a and the cylinder space 78b is supplied through the flow passages provided inside the square shank 71.

The flow passage 76a provided inside the square shank 71 is further split into the flow passage 76b and the flow passage 76c inside the square shank 71 and an outlet port 76g for the flow passage 76b is provided in a position facing the cylinder space 78a. Meanwhile, the flow passage 76d provided inside the square shank 71 is further split into the flow passage 76e and the flow passage 76f inside the square shank 71 and an outlet port 76h for the flow passage 76e is provided in a position facing the cylinder space 78b.

The outlet port 76g is provided on the left side of the pressure receiving plate 77a in FIG. 7 while the outlet port 76h is provided on the right side of the pressure receiving plate 77a in FIG. 7. These outlet ports 76g and 76h are located very close to the pressure receiving plate 77a. By locating the outlet ports very close to the pressure receiving plate 77a, it is possible to prevent interruption of the air supply to the cylinder spaces 78a and 78b when the slider 72 moves to the right and left.

The pressures inside the cylinder spaces are individually controlled by respectively supplying the air to the cylinder spaces 78a and 78b on the right and left of the pressure receiving plate 77a.

The air generated by the gas supply unit 21 (FIG. 2) is supplied to the flow passage 76a through piping 73a. The amount of the supplied air is controlled by a servo valve 74a. Similarly, the air generated by the gas supply Unit 21 is supplied to the flow passage 76d through piping 73b. The amount of the supplied air is controlled by a servo valve 74b.

A slider located on a lower side in FIG. 7 has a similar configuration to that of the above-described cylinder. Specifically, the square shank 71 includes a pressure receiving plate 77b located on a surface facing a lower side cylinder 72, and the cylinder space 78 of the slider 72 is divided into a cylinder space (air chamber) 78c and a cylinder space (air chamber) 78d by the pressure receiving plate 77b.

The pressure applied to the pressure receiving plate 77b varies depending on the amounts of air supplied to the cylinder space (air chamber) 78c and the cylinder space (air chamber) 78d of the slider 72. The slider 72 moves in the right-to-left direction by the difference in the pressure.

The amount of the air to be supplied to the cylinder space 78c is set equal to the amount of the air to be supplied to the cylinder space 78a. Likewise, the amount of the air to be supplied to the cylinder space 78d is set equal to the amount of the air to be supplied to the cylinder space 78b. By setting the configurations of the upper and lower cylinder spaces and the upper and lower pressure receiving plates equal to one another, a difference in traveling motion between the upper and lower sliders is avoided.

The following effects can be obtained by disposing the upper and lower cylinder spaces. Specifically, while a force attempting to float the slider 72 up from the square shank 71 is generated by the air servo pressures, it is possible to cancel that force by locating the cylinder spaces vertically opposite to each other and thereby to stabilize the clearance between the square shank 71 and the slider 72.

Moreover, it is possible to drive the center of gravity of the slider 72 and thereby to suppress vertical vibration such as pitching motion associated with the movement of the slider 72.

As described above, since all the piping for supplying the air to the slider 72 are located inside the square shank (base member) 71, it is possible to eliminate the piping in the vacuum chamber 70 for supplying the air, which has been provided in the conventional apparatus, and to avoid occurrence of rupture and other troubles of the conventional piping attributable to bending of the piping associated with the movement of the slider 72. In this way, since there are no movable portions for supplying the air, it is also possible to form the piping inside the square shank 71 by use of metal or ceramics. Hence the operation life of the piping will be virtually infinite.

Here, it is also possible to perform the air servo control by supplying the air to any one of the upper and lower cylinder spaces as long as stability of the movement of the slider 72 is ensured.

Figure 8:
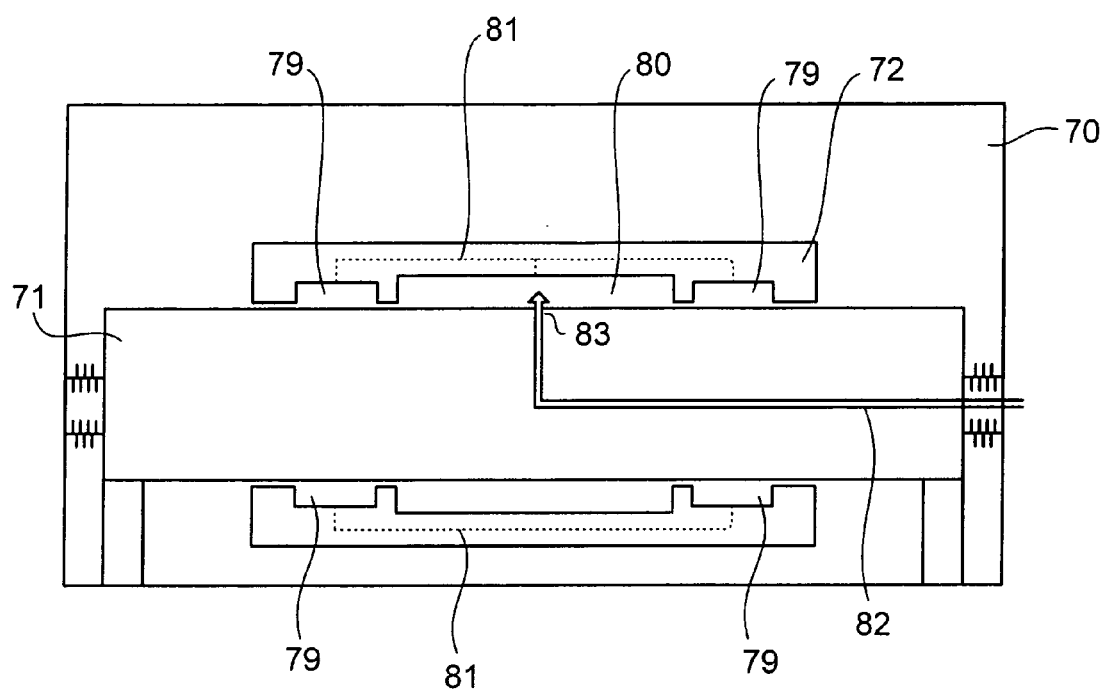
FIG. 8 is a schematic configuration diagram of main parts of the sample stage device provided with an air flow passage, which is located inside the square shank for supplying air to an air pad.

Next, the supply of the air to the air pads 79 of the slider 72 will be described with reference to FIG. 8. FIG. 8 shows a cross-sectional view of the square shank 71 and the slider 72 disposed in the vacuum chamber 70. This cross-sectional view is taken in a different position from that of the cross-sectional view in FIG. 7.

The air pads 79 are provided on the surface of the slider 72 facing the square shank 71 and an air supply groove 80 for supplying the air to the air pads 79 are provided on the same surface of the slider 72. The air supplied to the air supply groove 80 is sent to the air pads 79 through piping 81 formed (buried) inside the slider 72.

A flow passage 82 for feeding the air to be supplied to the air supply groove 80 is provided inside the square shank 71.

A length of the air supply groove 80 in a direction of movement of the slider is set to a sufficient length so as not to interrupt the air supply from the square shank 71 when moving the slider 72. Specifically, it is so designed that an outlet port 83 of the flow passage 82 is always located to face the air supply groove 80 despite the movement of the slider 72.

A floating force of the slider 72 generated by the pressure inside the air supply groove 80 can be used directly to cancel an own weight of the slider 72 by providing the air supply groove 80 only in the upper slider 72. For example, if a width of the air supply groove 80 is 2 mm and a length thereof is 300 mm, it is possible to generate a force of 24 kgf in the case of 0.4 MPa. For this reason, if the own weight of the slider 72 is 30 kg, it is possible to substantially cancel the own weight of the slider 72 and to maintain the clearances above and below the slider within proper ranges.

When the own weight does not need to be cancelled, the air supply grooves 80 may be provided symmetrically on the upper and lower sliders 72. In this case, it is possible to cancel the air pressures.

Here, the air supply groove 80 may be provided on the square shank 71 instead of the slider 72. When the air supply groove is provided on the square shank 71, a groove having the same size as that of the air supply groove 80 in FIG. 8 is formed on a surface of the square shank 71 facing the slider 72. Meanwhile, a suction port for suctioning the air to be supplied to the groove on the square shank 71 is provided on the slider 72. The suction port is connected to the piping 81 inside the slider 72.

As described above, since all the piping for supplying the air to the air supply groove 80 of the slider 72 is located inside the square shank 71, it is possible to eliminate the piping inside the vacuum chamber 70 for supplying the air, which has been provided in the conventional apparatus, and to avoid occurrence of rupture and other troubles of the conventional piping attributable to bending of the piping associated with the movement of the slider 72. In this way, since there are no movable portions for supplying the air, it is also possible to form the piping inside the square shank 71 by use of metal or ceramics. Hence the operation life of the piping will be virtually infinite.

(2) Second Embodiment

A second embodiment will describe an XY stage combining the slider mechanisms, which employ the air bearing stage formed of the square shank and the slider as described in the first embodiment.

Figure 9A:
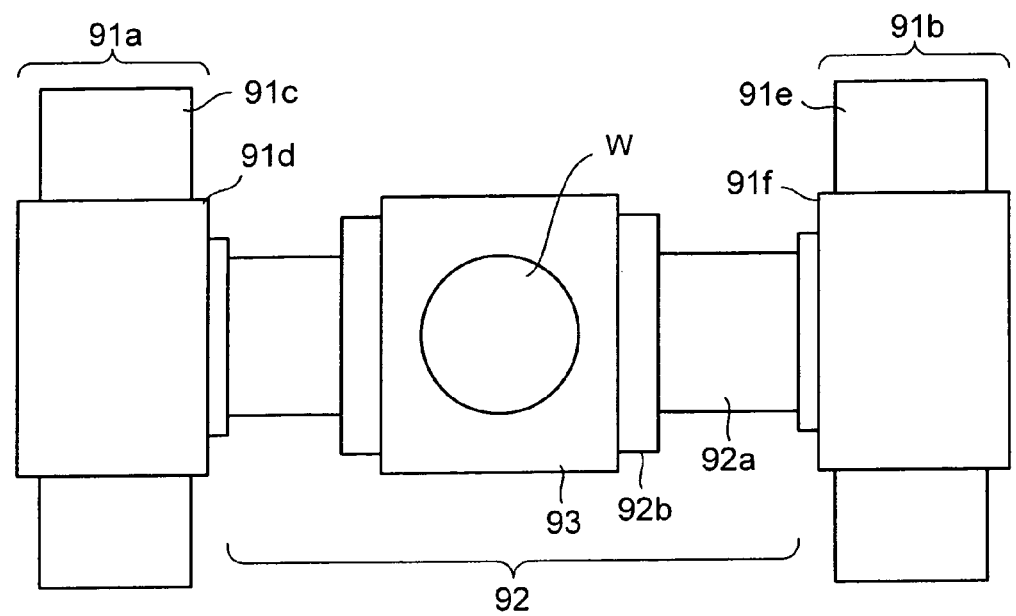
FIGS. 9A and 9B are schematic configuration diagrams of an XY sample stage device which moves in X and Y directions.
Figure 9B:
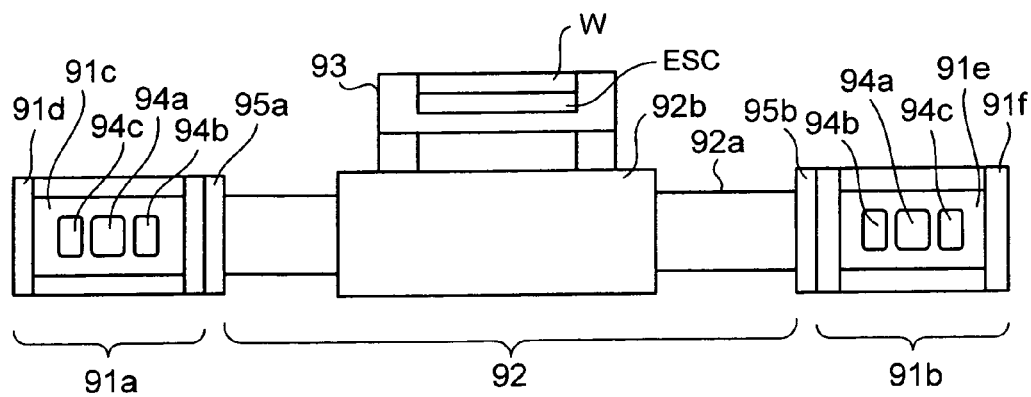

FIG. 9A shows a plan view of an H-type XY stage and FIG. 9B shows a cross-sectional view thereof. As shown in FIGS. 9A and 9B, the XY stage includes slider mechanisms 91a and 91b for an X axis and a slider mechanism 92 for a Y axis. The slider mechanism 91a includes a fixed square shank 91c to be fixed to the inside of a vacuum chamber, and a slider 91d. Similarly, the slider mechanism 91b includes a fixed square shank 91e and a slider 91f. The slider 91d and the slider 91f are configured to move in the same direction at the same time.

The slider mechanism 92 includes a square shank 92a, a slider 92b, and a wafer table 93. One end of the square shank 92a is connected to the slider 91d of the slider mechanism 91a through an end plate and the other end thereof is connected to the slider 91f of the slider mechanism 91b through an end plate. This square shank 92a will also be referred to as the movable square shank 92a.

The wafer table 93 is provided on a surface of the slider 92b of the slider mechanism 92 and a wafer W is fixed to the wafer table 93 by use of an electrostatic chuck ESC. The wafer W is moved to a desired position defined in XY coordinates by driving the slider mechanisms (91a and 91b) and the slider mechanism 92.

As shown in FIG. 9B, the sliders (91d and 91f) on the X axis and the slider 92b on the Y axis are disposed on the same plane. Accordingly, it is possible to align the centers of gravity for driving and to obtain a high motion performance without causing pitching or rolling.

Flow passages 94a for discharge to the atmosphere, flow passages 94b for a low vacuum, and flow passages 94c for a medium vacuum are provided inside the fixed square shanks (91c and 91e). Meanwhile, a flow passage for discharge to the atmosphere, a flow passage for a low vacuum, and a flow passage for a medium vacuum are also provided inside the movable square shank 92a and are connected to the corresponding flow passages in the fixed square shanks.

Figure 10:
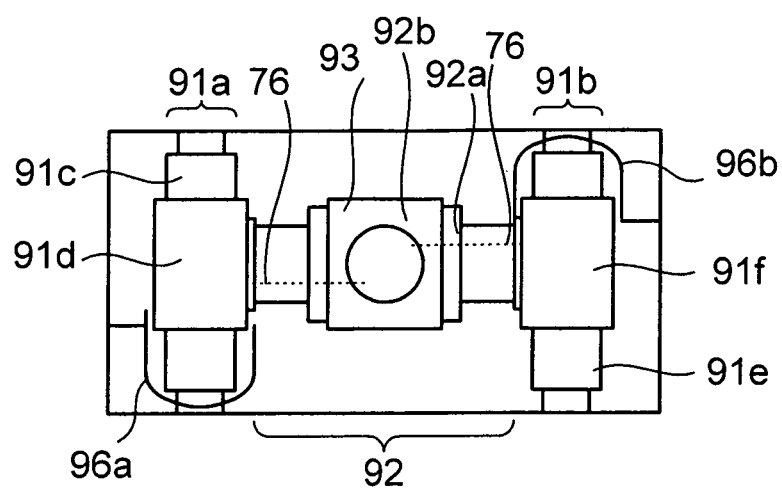
FIG. 10 is a view for explaining a layout of air supply pipes in a conventional XY sample stage device.
Figure 11:
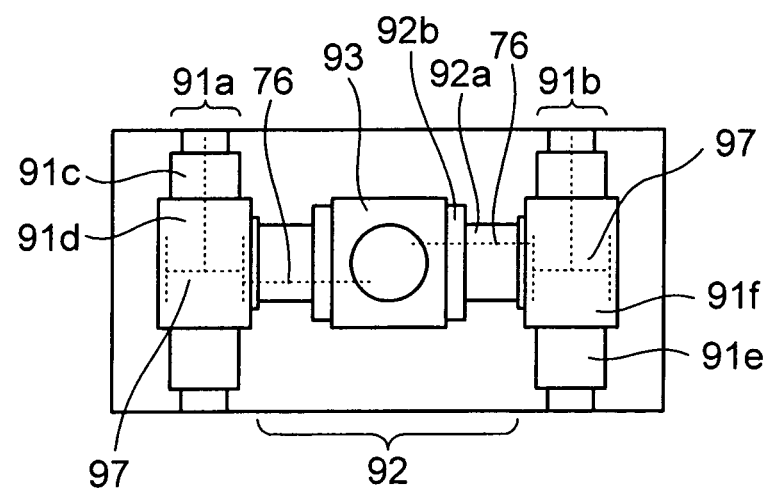
FIG. 11 is a schematic configuration diagram showing flow passages for air supply located inside square shanks.

FIG. 10 is a view for explaining a problem of conventional air piping in the XY stage, and FIG. 11 is a configuration diagram for explaining an outline of the XY stage according to this embodiment.

FIG. 10 shows an example in the case of using the movable square shank 92a provided with the air piping as described in conjunction with the first embodiment. As shown in FIG. 10, piping (96a and 96b) for the air to be supplied to the movable square shank 92a also moves along with the movement of the movable square shank 92a. Specifically, the bent portions are formed on the air piping (96a and 96b) and rupture of the piping and other troubles may occur depending on the number of times of bending actions. Hence the operating life of the stage device is determined by such rupture and the like.

On the other hand, in the XY stage device of this embodiment, as shown in FIG. 11, the flow passages for feeding the air are also provided inside the fixed square shanks (91c and 91e) corresponding to the X axis, so as to eliminate the piping (96a and 96b) provided in the chamber and configured to supply the air to the movable square shank 92a.

A connection structure of the air flow passages between the movable square shank 92a and the fixed square shanks (91c and 91e) will be described by using FIG. 12.

Figure 12:
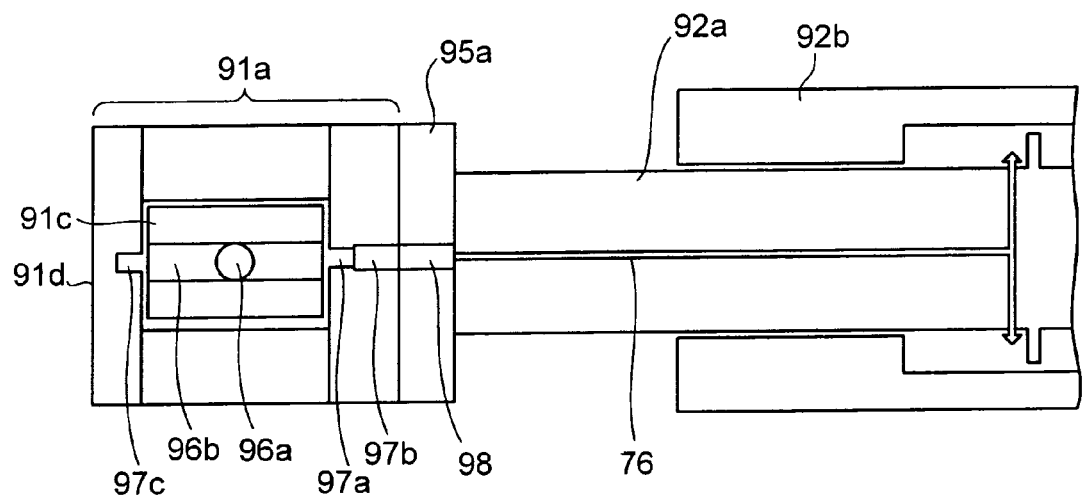
FIG. 12 is a schematic diagram showing configurations of air flow passages between a movable shank and fixed shank.

FIG. 12 is a cross-sectional view showing partial cross sections of the X axis and the Y axis of the XY stage. The X axis is formed of the fixed square shank 91c and fixed shank slider 91d formed to surround the fixed square shank 91c in a frame fashion. Meanwhile, an end plate 95a serving as a stopper for the slider 92b is provided on the Y axis side of the fixed shank slider 91d, i.e., on one surface close to the mobile square shank 92a.

The first fixed square shaft flow passage 96a is provided in the fixed square shaft 91c along the moving direction of the slider 91d while the second fixed square shaft flow passage 96b is provided in a predetermined position along a direction perpendicular to the fixed square shaft flow passage 96a. The second fixed square shaft flow passage 96b is formed to penetrate the fixed square shank 91c.

A first air supply groove 97a is provided on one surface (a surface close to the movable square shaft 92a) out of surfaces of the slider 91d facing the second fixed square shank flow passage 96b and in a position opposed to an outlet port thereof. Meanwhile, a second air supply groove 97c is provided symmetrically on the other surface and in a position opposed to an outlet port. The first air supply groove 97a is provided as the groove having a length covering a range of movement of the movable square shank 92a. Meanwhile, a passage hole 97b for discharging the air is formed from a portion of the first air supply groove 97a to the opposite side of the first air supply groove 97a. Another passage hole 98 configured to penetrate the end plate 95a is provided in a position aligned with this passage hole 97b.

An air inlet port for a flow passage 76 inside the movable square shank 92a is connected to the passage hole 98 on the end plate 95a.

Air flow passages similar to the above-described air flow passages in the slider mechanism 91a and the end plate 95a are also formed in the slider mechanism 91b and an end plate 95b, and are connected to the flow passage inside the movable square shank 92a.

The air generated by the air supply unit 21 (FIG. 2) is supplied to the flow passages 76 inside the movable square shank 92a through the above-described flow passages and the passage holes which are formed in the fixed square shanks (91c and 91e) of the slider mechanism 91a and the slider mechanism 91b, the sliders (91d and 91f) and the end plates (95a and 95b).

As described above, the piping buried in the movable square shank is allowed to penetrate from the end plate to the slider for the fixed square shank and is then connected to the piping inside the fixed square shanks. In this way, since all the piping routes are formed inside the square shanks and the sliders, it is possible to eliminate movable portions of the air servo piping that move along with movements of the sliders, whereby there is no piping left in the vacuum chamber. Accordingly, it is possible to eliminate occurrence of rupture and other troubles of the conventional piping attributable to bending of the piping associated with the movement of the sliders. Moreover, since there are no movable portions for supplying the air, it is also possible to form the piping inside the square shanks by use of metal or ceramics. Hence the operation life of the piping will be virtually infinite.

It is to be noted that the present invention is a patent application pertaining to the result of research entrusted by the Japanese national government or the like (i.e., a patent application subject to Article 19 of the Industrial Technology Enhancement Act of Japan, pertaining to the research titled "Development of Comprehensive Optimization Technologies to Improve Mask Design, Drawing and Inspection" which is conducted by New Energy and Industrial Technology Development Organization in fiscal year 2009).

What is claimed is:

1. A stage device to be used in a vacuum, comprising:
a gas supply unit configured to generate a gas;
a base member having upper, lower, right, and left surfaces;
a slider formed in a frame shape surrounding the base member and having surfaces facing the respective surfaces of the base member, and disposed to be movable; and
an air bearing configured to float the slider by supplying the gas to a space between the base member and the slider,
wherein the slider includes an air chamber provided on the surfaces facing the base member to accumulate air, an air pad to emit the air for floating the slider above the base member, and an air supply groove to supply the air to the air pad;
wherein the base member includes a slider-moving air flow passage buried therein to supply the gas from an inlet port to an outlet port to guide the gas generated by the gas supply unit for supplying the gas to the air chamber of the slider;
wherein the base member further includes an air flow passage buried therein to supply the air from the gas supply unit to the air supply groove formed on the slider;
wherein the air supplied to the air supply groove is sent to the air pad through an air flow passage buried inside the slider; and
wherein the air supply groove is provided only in the slider positioned above the upper surface of the base member.

2. The stage device according to claim 1, wherein
the base member includes a pressure receiving plate to divide the air chamber of the slider into a first air chamber and a second air chamber, and
the slider-moving air flow passage includes a first slider-moving air flow passage and a second slider-moving air flow passage to supply the air from the outlet port of the first slider-moving air flow passage to the first air chamber and to supply the air from the outlet port of the second slider-moving air flow passage to the second air chamber.

3. The stage device according to claim 2, wherein
the slider includes the air chambers located on both the upper and lower surfaces or both the right and left surfaces of the slider that are opposed to each other and facing the base member, and
the outlet ports of the slider-moving air flow passages formed inside the base member respectively supply the air to the air chambers on both the surfaces of the slider.

4. The stage device according to claim 3, further comprising:
a first slider and a second slider configured to move simultaneously in a direction perpendicular to a moving direction of the slider, wherein
one end of the base member is connected to the first slider and another end of the base member is connected to the second slider, and
the air supplied to any of the slider-moving air flow passage and the air flow passage for air pad inside the base member is supplied through the first slider and the second slider.

5. The stage device according to claim 4, wherein
the first slider is formed into a frame shape around a first fixed member and the second slider is formed into a frame shape around a second fixed member,
a flow passage inside the first slider is connected to a flow passage formed inside the first fixed member through a first air supply groove formed on a surface of the first slider facing the first fixed member, and
a flow passage inside the second slider is connected to a flow passage formed inside the second fixed member through a second air supply groove formed on a surface of the second slider facing the second fixed member.

6. The stage device according to claim 5, wherein
the flow passage formed inside the first fixed member is formed along a moving direction of the first slider, and is branched at a predetermined position into two in a direction perpendicular to the flow passage to pass through the first fixed member,
the flow passage formed inside the second fixed member is formed along a moving direction of the second slider, and is branched at a predetermined position into two in a direction perpendicular to the flow passage to pass through the second fixed member, a third air supply groove is formed on the first slider to be symmetrical to the first air supply groove with respect to the first fixed member, and a fourth air supply groove is formed on the second slider to be symmetrical to the second air supply groove with respect to the second fixed member.

7. The stage device according to claim 6, further comprising:

a first end plate located between the base member and the first slider; and a second end plate located between the base member and the second slider, wherein the slider-moving air flow passage formed inside the base member includes a first-slider moving air flow passage and a second-slider-moving air flow passage, the air is supplied to the first-slider-moving air flow passage through the flow passage formed inside the first fixed member, a passage hole formed inside the first slider, and a passage hole formed in the first end plate, and the air is supplied to the second-slider-moving air flow passage through the flow passage formed inside the second fixed member, a passage hole formed inside the second slider, and a passage hole formed in the second end plate.

8. The stage device according to claim 5, wherein an air flow passage for air pad formed inside the first slider is connected to an air flow passage for air pad formed inside the first fixed member through an air supply groove formed on the surface of the first slider facing the first fixed member.

9. The stage device according to claim 8, wherein the air flow passage for air pad formed inside the first fixed member is formed along the moving direction of the first slider, and is branched at a predetermined position into two in a direction perpendicular to the air flow passage for air pad to pass through the first fixed member, and an air supply groove is formed on the first slider to be symmetrical to the air supply groove with respect to the first fixed member.

10. The stage device according to claim 9, further comprising:

an end plate located between the base member and the first slider, wherein the air flow passage for air pad in the base member is supplied with the air through the air flow passage for air pad formed inside first fixed member, a passage hole formed inside the first slider, and a passage hole formed in the first end plate.

11. A stage device to be used in a vacuum, comprising:

a gas supply unit configured to generate a gas;

a base member having upper, lower, right, and left surfaces;

a slider formed in a frame shape surrounding the base member and having surfaces facing the respective surfaces of the base member, and disposed to be movable; and an air bearing configured to float the slider by supplying the gas to a space between the base member and the slider, wherein the slider includes an air chamber provided on the surfaces facing the base member to accumulate air, an air pad to emit the air for floating the slider above the base member, wherein the base member includes a slider-moving air flow passage buried therein to supply the gas from an inlet port to an outlet port to guide the gas generated by the gas supply unit for supplying the gas to the air chamber of the slider; and wherein the base member further includes an air supply groove formed on a surface of the member facing the slider.

\* \* \* \* \*